(12) United States Patent
Bayram et al.

(10) Patent No.: US 10,269,406 B2
(45) Date of Patent: Apr. 23, 2019

(54) ADAPTIVE REFRESHING AND READ VOLTAGE CONTROL SCHEME FOR A MEMORY DEVICE SUCH AS AN FEDRAM

(71) Applicant: UNIVERSITY OF PITTSBURGH—OF THE COMMONWEALTH SYSTEM OF HIGHER EDUCATION, Pittsburgh, PA (US)

(72) Inventors: Ismail Bayram, Pittsburgh, PA (US); Yiran Chen, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 15/594,807

(22) Filed: May 15, 2017

(65) Prior Publication Data

US 2017/0337962 A1    Nov. 23, 2017

Related U.S. Application Data

(60) Provisional application No. 62/338,606, filed on May 19, 2016.

(51) Int. Cl.
*G11C 11/406* (2006.01)
*G11C 11/4091* (2006.01)
(Continued)

(52) U.S. Cl.
CPC .......... *G11C 11/406* (2013.01); *G11C 11/223* (2013.01); *G11C 11/2273* (2013.01);
(Continued)

(58) Field of Classification Search
CPC .............. G11C 11/406; G11C 11/4091; G11C 11/4096
See application file for complete search history.

(56) References Cited

U.S. PATENT DOCUMENTS 6,067,244 A * 5/2000 Ma .................... G11C 11/22
365/145
9,852,785 B2 * 12/2017 Chih ................. G11C 11/2275
(Continued)

FOREIGN PATENT DOCUMENTS

WO    2016004388 A1    1/2016

OTHER PUBLICATIONS

Enes Eken et al., A New Field-assisted Access Scheme of STT-RAM with Self-reference Capability, Dept. of Electrical and Computer Engineering, University of Pittsburgh, T.J. Watson Research Center IBM; DAC'14, Jun. 1-5, 2014, San Francisco, CA; licensed to ACM 978-1-4503-2730—May 14, 2006.
(Continued)

*Primary Examiner* — Sung Cho
(74) *Attorney, Agent, or Firm* — Eckert Seamans Cherin & Mellott, LLC; Philip E. Levy

(57) ABSTRACT

A memory device, such as an FeDRAM device, includes a memory array including a plurality of rows, each row having a plurality of storage elements (e.g., FeFETs). The memory device further includes a plurality of refresh trigger circuits, each refresh trigger circuit being associated with a respective one of the rows. Each refresh trigger circuit is structured to produce an output signal indicative of an estimated degradation of a memory window of one or more of the storage elements of the associated one of the rows. The memory device also further includes control circuitry coupled to each of the refresh trigger circuits, wherein the control circuitry is structured and configured to determine whether to initiate a refresh of the storage elements of a particular one of the rows based on the output signal produced by the refresh trigger circuit associated with the particular one of the rows.

20 Claims, 6 Drawing Sheets

(51) Int. Cl.
　　　*G11C 11/4096*　　(2006.01)
　　　*G11C 11/404*　　(2006.01)
　　　*G11C 11/4099*　　(2006.01)
　　　*G11C 11/22*　　(2006.01)

(52) U.S. Cl.
　　　CPC ........ *G11C 11/404* (2013.01); *G11C 11/4091* (2013.01); *G11C 11/4096* (2013.01); *G11C 11/4099* (2013.01)

(56) References Cited

U.S. PATENT DOCUMENTS

| | | | | |
|---|---|---|---|---|
| 2004/0062071 A1* | 4/2004 | Rodriguez | ............. | G11C 11/22 365/145 |
| 2006/0221712 A1* | 10/2006 | Lowrey | ............... | G11C 7/14 365/189.07 |
| 2008/0094914 A1* | 4/2008 | Park | ................. | G11C 16/349 365/185.24 |
| 2013/0015517 A1* | 1/2013 | Widjaja | .............. | G11C 11/404 257/316 |
| 2017/0140807 A1* | 5/2017 | Sun | ..................... | G11C 29/023 |

OTHER PUBLICATIONS

Yixin Luo et al., WARM: Improving NAND Flash Memory Lifetime with Write-hotness Aware Retention Management; 978-1-4673-7619—Aug. 2015, © 2015 IEEE.

U. Schroeder et al., Non-volatile data storage in HfO2-based ferroelectric FETs; 978-1-4673-2848—Jul. 2012, © 2012 IEEE.

Xiao Pan et al., Retention mechansim study of the ferroelectric field effect transistor; Appl. Phys., Lett. 99, 013505 (2011); view online: http://dx.doi.org/10.1063/1.3609323.

IOP Science, Polarization Fatigue Characteristics of Sol-Gel Ferroelectric . . . Film Capacitors; Jpn. J. Appl. Phys. vol. 33 (1994) pp. 3996-4002, Part 1. No. 7A, Jul. 1994.

Hang-Tin Lue et al., Device Modeling of Ferroelectric Memory Field-Effect Transistor for the Application of Ferroelectric Random Access Memory; IEEE Transactions on Ultrasonics, Ferroelectrics and Frequency Control, vol. 50, No. 1, Jan. 2003.

Ekaterina Yurchuk et al., Impact of Scaling on the Performance of HfO2-Based Ferroelectric Field Effect Transistors; IEEE Transactions on Electron Devices, vol. 61, No. 11, Nov. 2014.

T.P. Ma, FEDRAM: A Capacitor-less DRAM Based on Ferroelectric-Gated Field-Effect Transistor, Invited Paper, Dept. of Electrical Engineering, Yale University, New Haven, CT; 978-1-4799-3569—Mar. 2014, © 2014 IEEE.

Stefan Mueller et al., From MFM Capacitors Toward Ferroelectric Transistors: Endurance and Disturb Characteristics of HfO2-Based FeFET Devices; IEEE Transactions on Electron Devices, vol. 60, No. 12, Dec. 2013.

Dragan Damjanovic, Hysteresis in Piezoelectric and Ferroelectric Materials, The Science of Hysteresis, vol. 3; I. Mayergoyz and G. Bertotti (Eds.); Elsevier (2005).

I. Arias et al., A phenomenological cohesive model of ferroelectric fatigue, Div. of Engineering and Applied Science, California Institute of Technology, Pasadena, CA 91125; Dept. de Matematica Aplicada III, Universitat Politecnica de Catalunya, Barcelona 08034, Spain.

* cited by examiner

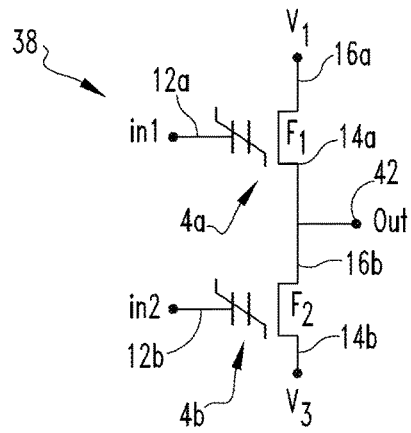
*FIG.4*
|  | In1 | In2 | $V_1$ | $V_2$ |
|---|---|---|---|---|
| READ | $V_{read}$ | $V_{read}$ | $V_{rref}$ | $G_{nd}$ |
| Write '0' | $V_{high}$ | $V_{low}$ | $V_{high}$ | $V_{high}$ |
| Write '1' | $V_{high}$ | $V_{low}$ | $V_{low}$ | $V_{low}$ |
*FIG.5*
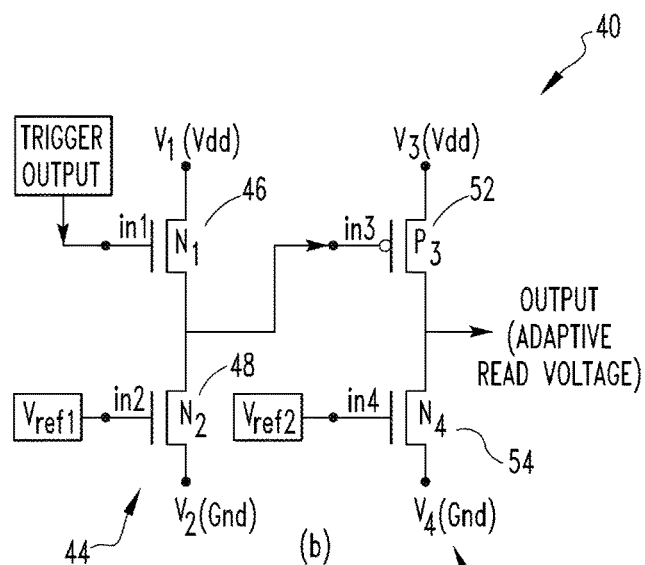
*FIG.6*

ADAPTIVE REFRESHING AND READ VOLTAGE CONTROL SCHEME FOR A MEMORY DEVICE SUCH AS AN FEDRAM

CROSS-REFERENCE TO RELATED APPLICATIONS

This application claims priority under 35 U.S.C. § 119(e) from U.S. provisional patent application No. 62/338,606, entitled "Adaptive Refreshing and Read Voltage Control Scheme for FeDRAM" and filed on May 19, 2016, the contents of which are incorporated herein by reference.

GOVERNMENT CONTRACT

This invention was made with government support under grant 1448305 awarded by the National Science Foundation (NSF). The government has certain rights in the invention.

BACKGROUND OF THE INVENTION

1. Field of the Invention

The present invention pertains to memory devices, such as ferroelectric dynamic random access memories (FeDRAMs), and, in particular, to adaptive refreshing and read voltage control schemes for memory devices such as FeDRAMs.

2. Description of the Related Art

When complementary metal-oxide-semiconductor (CMOS) technology scaling approaches its physical limit, emerging nonvolatile memory technologies, such as ferroelectric dynamic random access memory (FeDRAM), magnetic memory (MRAM), resistive memory (RRAM), and phase change memory (PCM), start to draw attention from both academia and industry. The attractive features of these technologies include nanosecond access time, small footprint, and non-volatility (i.e., zero standby power).

A FeDRAM device is a random-access memory similar in construction to a dynamic random access memory (DRAM). FeDRAM devices, however, use ferroelectric held effect transistors (FeFETs) as storage elements to achieve non-volatility. FIG. 1 is a schematic diagram of an exemplary memory array 2 that may be used to form an exemplary prior art FeDRAM device. As seen in FIG. 1, memory array 2 includes a plurality of FeFETs 4 arranged in an n row by m column array. As also seen in FIG. 1, the gate electrodes of the FeFETs 4 in a row are connected to a common word line (WL), the source electrodes of the FeFETs 4 in a column are connected to a common source line (SL), and the drain electrodes of the FeFETs 4 in a column are connected to a common bit line (BL).

A FeFET has a structure similar to that of a conventional CMOS transistor, except that, as described below, a FeFET has a modified gate stack. As a result, FeFETs promise excellent CMOS integration compatibility and manufacturing scalability. In addition, the recent discovery of hafnium dioxide ($HfO_2$) dielectric material enables the construction of ultra-thin (e.g., 8 nm) ferroelectric layers, thereby paving the long-term scaling path of FeFET devices.

The only significant difference between an FeFET and a conventional MOSFET is the addition of a ferroelectric layer placed between the metal and the insulator layers at the gate stack of the FeFET. An example FeFET 4 is shown in FIGS. 2A, 2B and 2C (as described below, FIGS. 2A, 2B and 2C show FeFET 4 in two different programming states). FeFET 4 includes a p-Si substrate 6, an insulator layer 8 provided on top of substrate 6, a ferroelectric layer 10 provided on top of insulator layer 8, and a gate electrode 12 provided on top of ferroelectric layer 10. FeFET 4 further includes a source electrode 14 and a drain electrode 16.

Data is stored in FeFET 4 by programming ferroelectric layer 10 to different polarization states. In particular, during write operations, an electrical field higher than a certain threshold (i.e., a coercive field), is applied to FeFET 4. The direction of the electrical field determines the polarization of ferroelectric layer 10. FIGS. 2A, 2B and 2C show the biasing conditions of exemplary FeFET 4 when programming logic "1" and logic "0" states, respectively. The term "remnant polarization" is used to denote the remaining polarization after the programming voltages are removed from the terminals of FeFET 4. The two opposite remnant polarization states create two different voltage threshold ($V_{th}$) states corresponding to logic "1" and logic "0". Due to the $V_{th}$ difference, FeFET 4 requires specific gate voltages based on its logic state to turn on, and the difference between those gate voltages is called "memory window."

As just described, in an FeDRAM device, data is stored in each memory element, or "FeDRAM cell", as the polarization state of the ferroelectric layer in the FeFET and is reflected as the changeable channel conductivity. In write operations, the polarization state can be programmed to different levels by applying appropriate voltages to the three terminals of the FeFET. The data retention time of a FeDRAM cell denotes the time period for which the data can be retained without power supply. Data retention time is thus a measure of the degree of non-volatility of the FeDRAM cell. Data retention time is mainly determined by two mechanisms: (i) the depolarization field and (ii) the leakage. Programming the polarization state of a FeDRAM cell to the maximum level will provide the longest retention time. Programming to such a maximum voltage level, however, will often cause severe degradation of the "endurance" of the memory cell (i.e., the cycles for which the memory cell can be programmed). Endurance and data retention time are thus inversely related to one another.

Many applications of FeDRAM, such as a main memory with frequent write accesses, require high endurance. In such a case, it may be worthwhile to trade the degree of non-volatility of the FeDRAM cell (i.e., shortens the data retention time) for increased endurance by not programming the polarization of the ferroelectric layer to its maximum level. A lower degree of non-volatility (i.e., shortened data retention time), however, requires more frequent refreshing operations.

In addition, during system executions, the memory window of an FeDRAM cell can be also disturbed by the write and read accesses to its associated memory array. In particular, referring to the exemplary memory array 2 shown in FIG. 1, during a write operation wherein a logic "1" is written to cell $F_{00}$, a program voltage $V_{prog}$ is usually applied to $WL_0$ while $BL_0$ and $SL_0$ are connected to Gnd. On the contrary, during a write operation wherein a logic "0" is written to cell $F_{00}$, $V_{prog}$ is applied to $BL_0$ and $SL_0$ while $WL_0$ is connected to Gnd. In such write operations, the FeDRAM cells that are not being written will still be effected by the voltages applied on the SL, BL and WL lines shared with the cell that is being programmed. For example, when writing "0" to cell $F_{00}$, the unselected cells at the same column but different rows (e.g., $F_{(n-1)0}$) will observe the $V_{prog}$ applied on their BL and SL lines too. To minimize the impact of such disturbances, prior art schemes have been developed wherein the WL of the unselected cells at the same column but different rows are raised to predefined voltage levels, e.g., or $V_{prog}/2$ or $V_{prog}/3$, to prevent the cell from being completely switched. During a read operation, a predefined read voltage is applied on the selected WL. The BLs of the cells in the selected row are connected to a sense voltage and their SLs are connected to a sense amplifier for data reading. Although the read voltage is generally much smaller than the write voltage, reading an FeDRAM cell may also disturb the unselected cells in the array and slowly change the polarization states of them.

There is thus room for improvement in memory devices, such as FeDRAM devices, including improvements in schemes that are used for determining when to refresh such devices and for determining appropriate read voltages to use in such devices.

SUMMARY OF THE INVENTION

In one embodiment, a memory device, such as an FeDRAM device, is provided that includes a memory array including a plurality of rows, each row having a plurality of storage elements (e.g., FeFETs). The memory device further includes a plurality of refresh trigger circuits, each refresh trigger circuit being associated with a respective one of the rows. Each refresh trigger circuit is structured to produce an output signal indicative of an estimated degradation of the memory window of one or more of the storage elements of the associated one of the rows. The memory device also further includes control circuitry coupled to each of the refresh trigger circuits, wherein the control circuitry is structured and configured to determine whether to initiate a refresh of the storage elements of a particular one of the rows based on the output signal produced by the refresh trigger circuit associated with the particular one of the rows.

In another embodiment, a method of controlling a memory device including a memory array having a plurality of rows is provided. The method includes producing for each of the rows an output signal indicative of an estimated degradation of the memory window of one or more of the storage elements of the row, and determining whether to initiate a refresh of the storage elements of a particular one of the rows based on the output signal associated with the particular one of the rows.

In still another embodiment, a memory device is provided that includes a memory arrays including a plurality of rows, each row having a plurality of storage elements, and a plurality of degradation monitoring circuits, each degradation monitoring circuit being associated with a respective one of the rows. Each degradation monitoring circuit is structured to produce an output signal indicative of an estimated degradation of the memory window of one or more of the storage elements its associated row. The memory device also includes an adaptive read voltage generation circuit coupled to each of the degradation monitoring circuits, wherein the adaptive read voltage generation circuit is structured and configured to generate a read voltage for a selected one of the rows based on the output signal produced by the degradation monitoring circuit associated with the selected one of the rows.

In yet another embodiment, a method of controlling a memory device including a memory array having a plurality of rows is provided. The method includes producing for each of the rows an output signal indicative of an estimated degradation of the memory window of one or more of the storage elements of the row, and generating a read voltage for a selected one of the rows based on the output signal produced by the degradation monitoring circuit associated with the selected one of the rows.

BRIEF DESCRIPTION OF THE DRAWINGS

FIG. 4 is a schematic diagram of a refresh trigger circuit according to one particular, non-limiting exemplary embodiment of the disclosed concept;

FIG. 5 is a table that illustrates various bias voltages that must be applied to refresh trigger circuit shown in FIG. 4 according to aspects of the disclosed concept;

FIG. 6 is a schematic diagram of an adaptive read voltage generation circuit according to an exemplary embodiment of the disclosed concept.

DETAILED DESCRIPTION OF EXEMPLARY EMBODIMENTS

Figure 1:
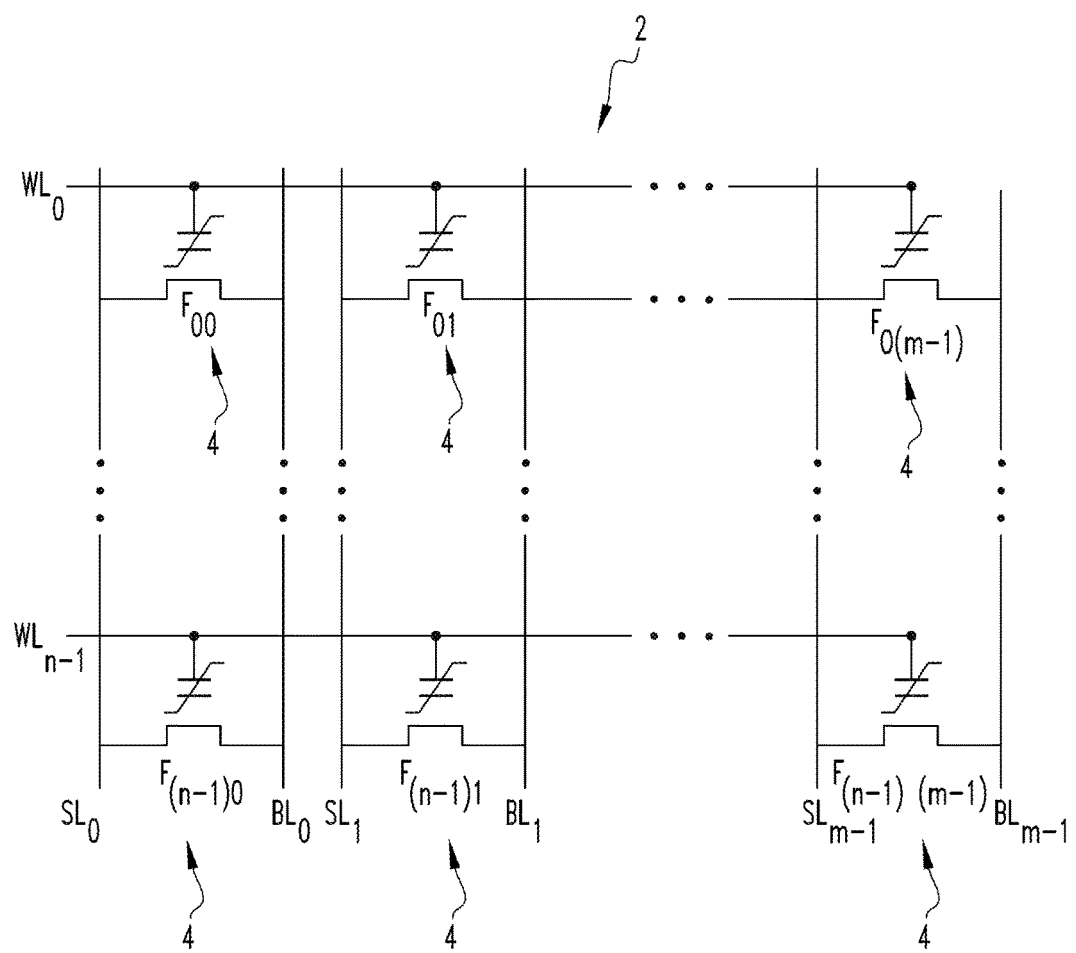
FIG. 1 is a schematic diagram of an exemplary memory array that may be used to form an exemplary prior art FeDRAM device.
Figure 2A:
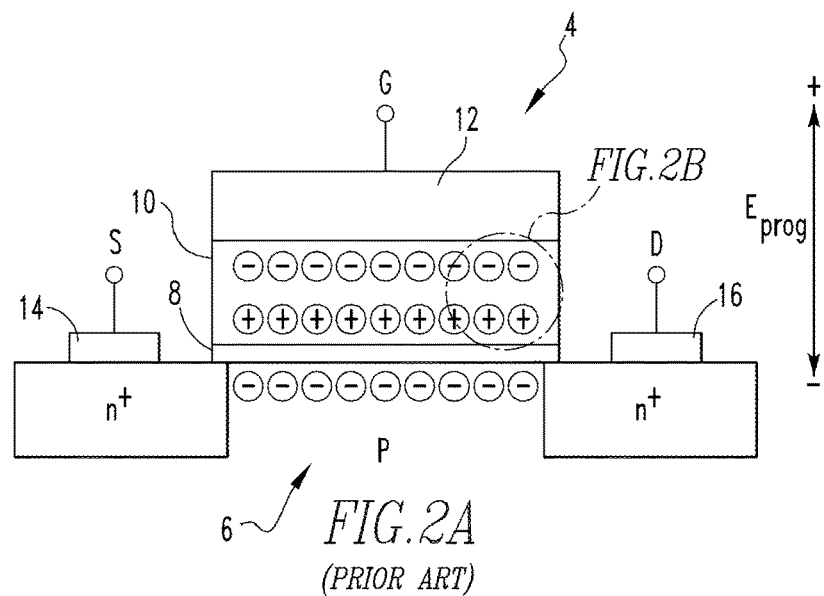
FIGS. 2A, 2B and 2C show the biasing conditions of an exemplary FeFET when programming logic "1" and logic "0" states, respectively.
Figure 2B:
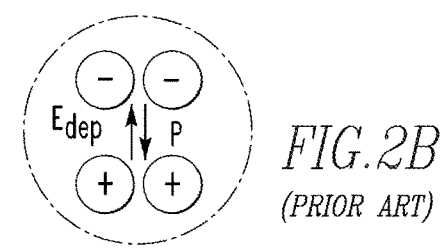
Figure 2C:
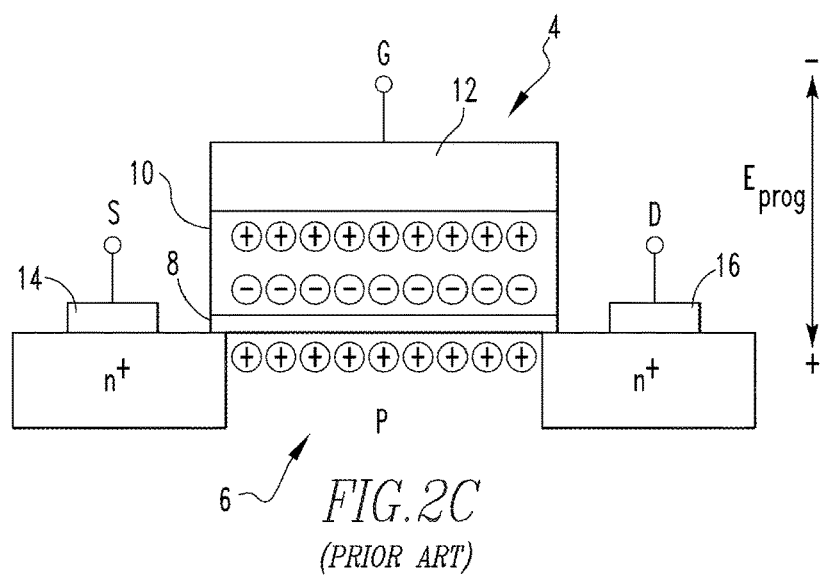

As used herein, the singular form of "a", "an", and "the" include plural references unless the context dearly dictates otherwise.

As used herein, the statement that two or more parts or components are "coupled" shall mean that the parts are joined or operate together either directly or indirectly, i.e., through one or more intermediate parts or components, so long as a link occurs.

As used herein, "directly coupled" means that two elements are directly in contact with each other.

As used herein, the term "number" shall mean one or an integer greater than one (i.e., a plurality).

As used herein, the terms "module" and "component" are intended to refer to a computer related entity, either hardware (e.g., integrated circuit), a combination of hardware and software (e.g., firmware), software, or software in execution. For example, a module or component can be, but is not limited to being, a process running on a processor, a processor itself, an object, an executable, a thread of execution, a program, and/or a computer.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject invention. It will be evident, however, that the disclosed concept can be practiced without these specific details without departing from the spirit and scope of this innovation.

As described in detail herein, the disclosed concept provides, in one aspect, an adaptive refreshing scheme which tracks the degradation of memory window over time and refreshes the memory cells of a memory array, such as an FeDRAM array, only when necessary. The disclosed scheme reduces the number of refresh operations as well as the incurred energy consumption, and prolongs the lifetime of the memory cells (e.g., FeDRAM cells). The read reliability of the memory cells is also improved according to another aspect of the disclosed concept by adaptively adjusting the read voltage to overcome the degradation of the memory window.

Figure 3A:
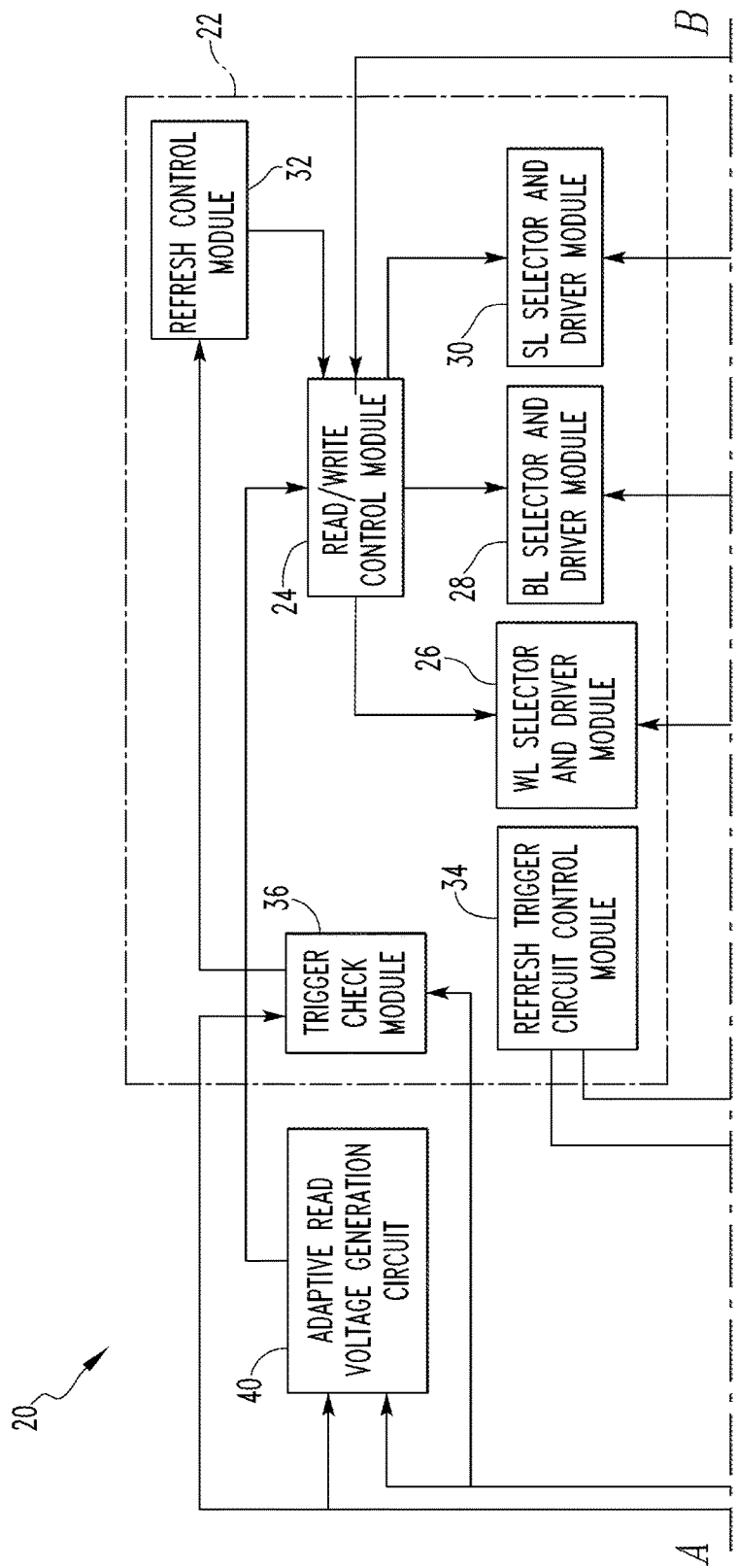
FIGS. 3A and 3B are a schematic diagram of a memory device according to a non-limiting exemplary embodiment of the disclosed concept.
Figure 3B:
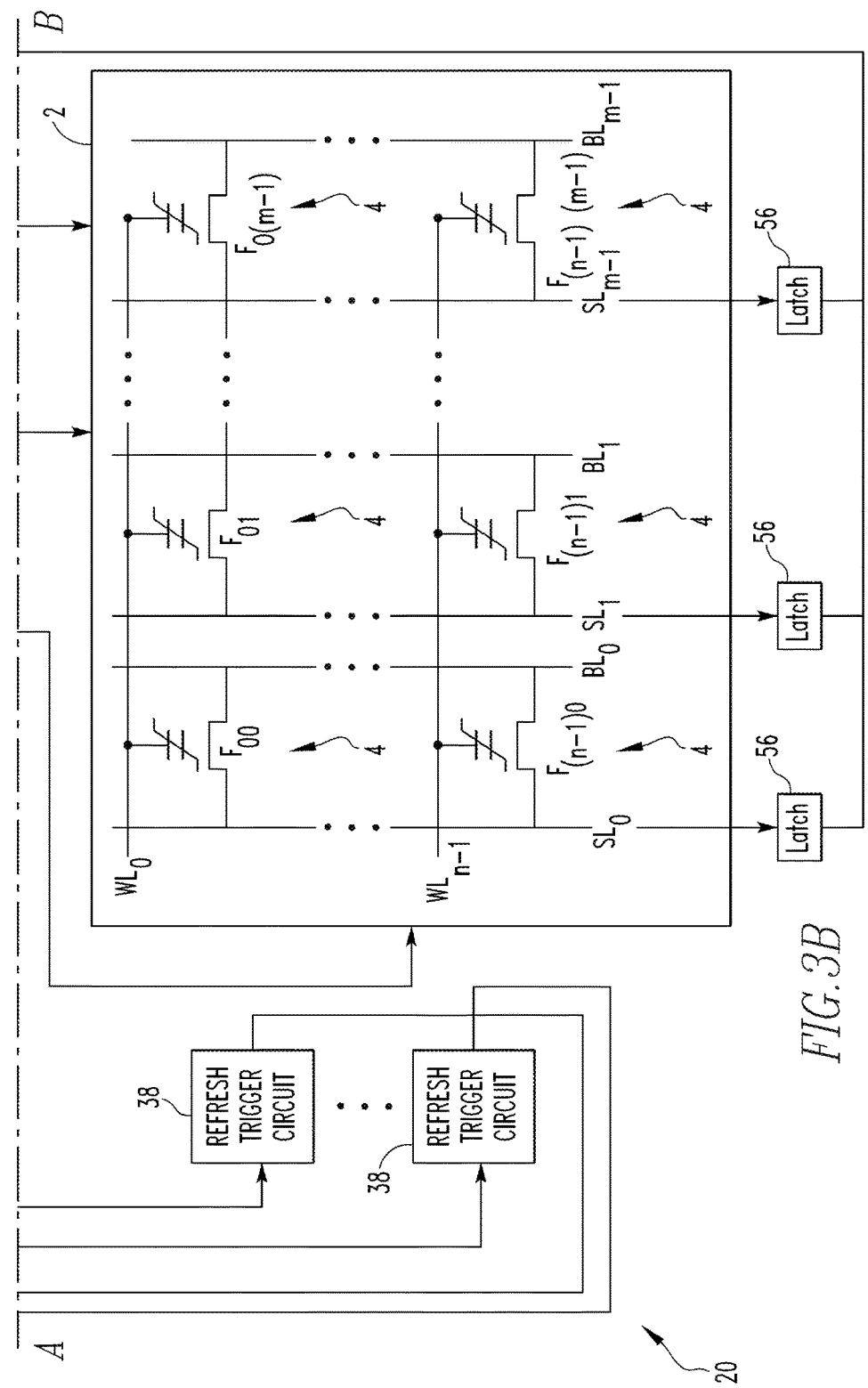

FIGS. 3A and 3B are a schematic diagram of a memory device 20 according to a non-limiting exemplary embodiment of the disclosed concept. Exemplary memory device 20 includes a memory array 2 having a plurality of FeFETs 4 arranged in an n row by m column array as described elsewhere herein (FIG. 1). It will be understood, however, that this is meant to be exemplary only and that memory device 20 can also include storage elements or cells arranged in an array that are not FeFET based.

Memory device 20 further includes control circuitry 22 that is operatively coupled to memory array 2 for controlling the operation thereof as described herein. Control circuitry 22 includes a number of modules or components (described in more detail herein) that each perform a different function for controlling operation of memory device 20. As seen in FIGS. 3A and 3B, the exemplary control circuitry includes a read/write control module 24, a word line selector and driver module 26, a bit line selector and driver module 28, a source line selector and driver module 30, a refresh control module 32, a refresh trigger circuit control module 34, and a trigger check module 36. Read write control module 24 is structured to receive an operation identifier (e.g., a write command identifier or a read command identifier), an address in memory array 2 to which data is to be written or from which data is to be read, and, in the case of a write command, the actual data that is to be written. Read/write control module 24 is further structured to control word line selector and driver module 26, bit line selector and driver module 28, and source line selector and driver module 30 and apply appropriate bias voltages to selected FeFETs 4 in memory array 2 in order to write data to memory array 2 or read data from a memory array 2 as appropriate.

In addition, as seen in FIGS. 3A and 3B, memory device 20 further includes a plurality of (i.e., n) refresh trigger circuits 38, wherein each refresh trigger circuit 38 is associated with a respective one of the n rows of FeFETs 4 in memory array 2. According to an aspect of the disclosed concept, and as described below, each refresh trigger circuit 38 is structured to produce an output voltage signal that is indicative of an estimate of the degradation of the memory window of one or more of the FeFETs 4 in the associated row. Each refresh trigger circuit 38 is operably coupled to refresh trigger circuit control module 34 which is structured to control the biasing of each refresh trigger control circuit 38 as described in detail below. In addition, the output voltage of each refresh trigger circuit 38 is provided to both tripper check module 36 and an adaptive read voltage generation circuit 40 (the latter is described in greater detail below). Trigger check module 36 is coupled to refresh control module 32 and is structured to monitor the output voltages of the refresh trigger circuits 38. As described in greater detail herein, refresh control module 32 determines when to initiate the refresh of the FeFETs 4 in a row in memory array 2 by way of read/write control module 24 based upon the output of trigger check module 36. This aspect of the disclosed concept is described in greater detail herein. Furthermore, adaptive read voltage generation circuit 36 is structured to generate an adapted/adjusted read voltage for use by read/write control module 24 when reading data from a row of FeFETs 4 in memory array 2. As described herein, adapted/adjusted read voltage is based upon the outputs of the refresh trigger circuits 38.

FIG. 4 is a schematic diagram of refresh trigger circuit 38 according to one particular, non-limiting exemplary embodiment. As seen in FIG. 4, refresh trigger circuit 38 includes a first FeFET 4a having a first gate 12a, a first drain 16a, and a first source 14a. Refresh trigger circuit 38 further includes a second FeFET 4b having a second gate 12b, a second drain 16b, and a second source 14b. First source 14a is connected to second drain 16b at a point of interconnection 42. As a result, first FeFET 4a and second FeFET 4b are connected in series.

In addition, as noted elsewhere herein, refresh trigger circuit 38 is structured to produce an output voltage that estimates the degradation over time of the memory window of the FeFETs 4 that are in the row of memory array 2 with which refresh trigger circuit 38 is associated. In the exemplary embodiment, this functionality is achieved by first "initializing" refresh trigger circuit 38 by programming first FeFET 4a to a first state (e.g., logic "1") and programming second FeFET 4b to a second state (e.g., logic "1") different than the first state. As a result of such programming, when thereafter a first predetermined bias is applied to first drain 16a, a second predetermined bias is applied to second source 14b, and a read voltage is applied to first gate 12a and second gate 12b, the voltage output produced at point of interconnection 42 will be able to be read. That output voltage will be indicative of the memory window degradation in the row that is associated with refresh trigger circuit 38. More specifically, after being initialized as described, the polarization level of first FeFET 4a ($F_1$) and second FeFET 4b ($F_2$) will start to decay, and the resistances of both first FeFET 4a and second FeFET 4b will change accordingly. This change will result in a reduction of the voltage at point of interconnection 42 that is proportional to the amount of memory window degradation that has occurred up until that point. As described in detail elsewhere herein, according to an aspect of the disclosed concept, the voltage output produced at point of interconnection 42 that is indicative of memory window degradation is used to trigger the refresh of FeFETs 4 in memory array 2. FIG. 5 is a table that illustrates the various bias voltages that must be applied to FeFETs 4a and 4b in order to: (i) read the output voltage at point of interconnection 42 (the first row in the table) and, (ii) in two sequential steps (the second and third rows table), program FeFETs 4a and 4b to the opposite states just described.

FIG. 6 is a schematic diagram of adaptive read voltage generation circuit 40 according to an exemplary embodiment of the disclosed concept. As noted elsewhere herein, adaptive read voltage generation circuit 40 is used to adjust the read voltages that are used by control circuitry 22 to perform read operations on memory array 2. As seen in FIG. 6, adaptive read voltage generation circuit 40 includes a first divider circuit 44 that includes a first divider transistor 46 coupled to a second divider transistor 48. Adaptive read voltage generation circuit 40 further includes a second divider circuit 50 that includes a third divider transistor 52 coupled to a fourth divider transistor 54. As seen FIG. 6, second divider circuit 50 is cascaded with first divider circuit 44. The gate voltage of first divider transistor 46 is controlled by the voltage that is output by the refresh trigger circuit 38 that is associated with the row within memory array 2 that is being read. Also, the gate voltage of second divider transistor 48 is controlled by a first bias voltage ($V_{ref1}$), the gate voltage of third divider transistor 52 is controlled by the output of first divider circuit 48 (at the point of interconnection of first divider transistor 46 and second divider transistor 48), and the gate voltage of fourth divider transistor 54 is controlled by a second bias voltage ($V_{ref2}$). The output of second divider circuit 50 (at the point of interconnection of third divider transistor 52 and fourth divider transistor 54) provides the read voltage that is to be used by read/write control module 24 for reading the identified row in memory array 2.

Figure 7:
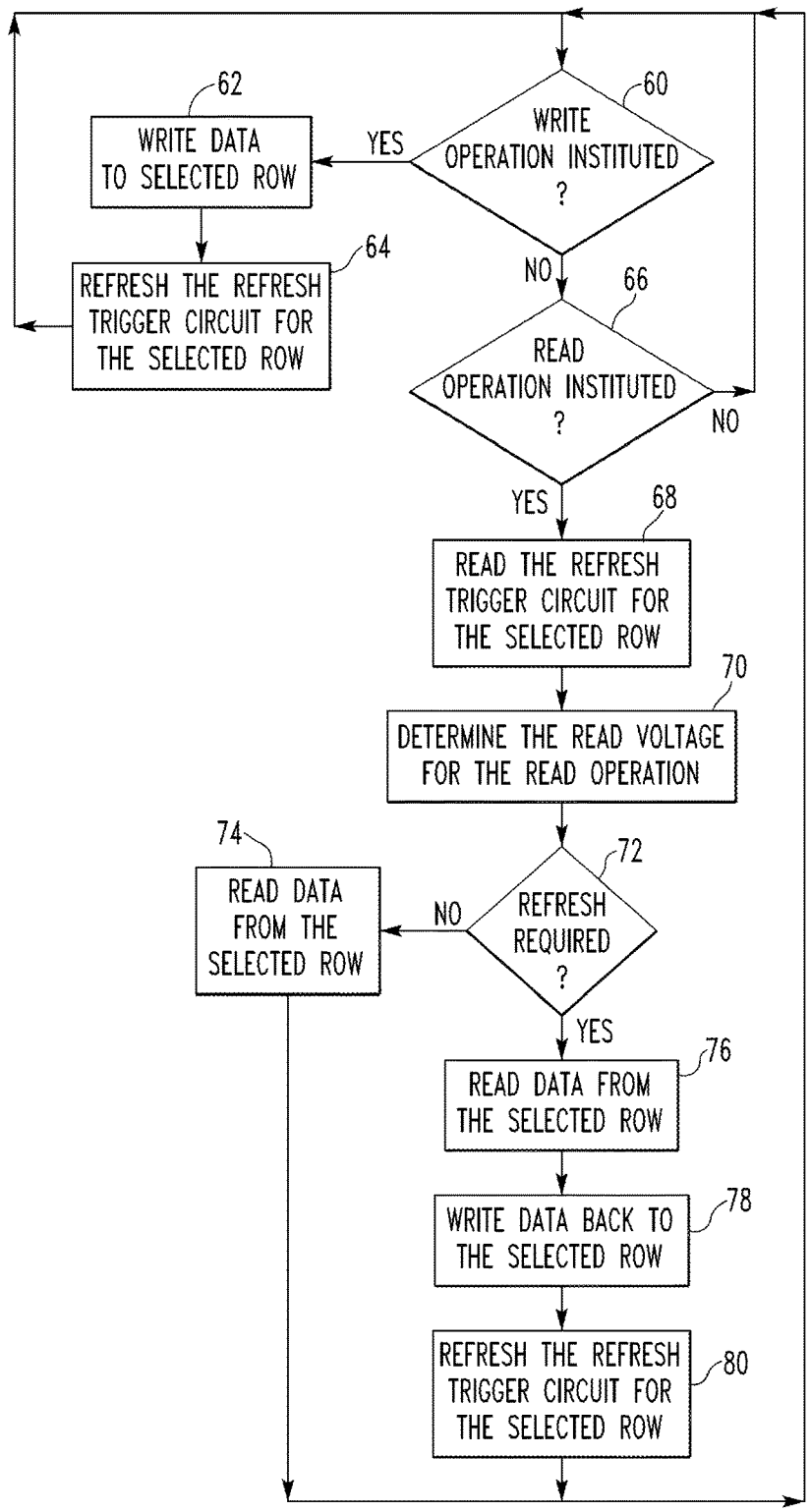
FIG. 7 is a flowchart illustrating operation of the memory device of FIGS. 3A and 3B according to an exemplary embodiment of the disclosed concept.

FIG. 7 is a flowchart illustrating operation of memory device 20 according to an exemplary embodiment of the disclosed concept. As described below, during such operation, the degradation of memory window in the rows of memory array 2 is tracked over time and the FeFETs 4 in any row are refreshed only when necessary. As a result, the number of refresh operations and the energy consumption is minimized. In addition, the read voltages employed by memory device 20 are adaptively adjusted to overcome the degradation of the memory window.

Referring to FIG. 7, the method begins at step 60, wherein control circuitry 22 makes a determination as to whether a write operation has been instituted. If the answer at step 60 is yes, then, at step 62, the data is written to the selected row of memory array 22 by operation of read/write control module 24 and the selector and driver modules 26, 28 and 30. Then, at step 64, the refresh trigger circuit 38 associated with the selected row is "refreshed," meaning that refresh trigger circuit 38 is initialized as described above such that first FeFET 4a and second FeFET 4b thereof are programmed to opposite states (see rows 2 and 3 of the table of FIG. 5 for the bias voltages required to do so in the exemplary embodiment). The method then returns to step 60.

If, however, the answer at step 60 is no, then the method proceeds to step 66. In step 66, control circuitry 22 makes a determination as to whether a read operation has been instituted. If the answer is no, then the method returns to step 60. If, however, the answer at step 66 is yes, then the method proceeds to step 68. At step 68, the refresh trigger circuit 38 that is associated with the selected row is read (to determine the voltage at point of interconnection 42) by applying the biases shown in FIG. 5. Next, at step 70, the adjusted read voltage that is to be used for the read operation is determined by adaptive read voltage generation circuit 40 as described herein. Next, at step 72, a determination is made as to whether a refresh of the row being read is required as determined by the refresh trigger scheme of the disclosed concept. In particular, at step 72, the voltage at point of interconnection 42 as determined in step 68 is compared to a predetermined threshold value using, for example, and without limitation, a comparator and an appropriate reference voltage. If the voltage at point of interconnection 42 is greater than or equal to the predetermined threshold value, then a refresh is not required and the method proceeds to step 74. At step 74, the selected row of memory array 2 is read by operation of read/write control module 24 and the selector and driver modules 26, 28 and 30 using the read voltage determined in step 70. Thereafter, the method returns to step 60.

If, however, the voltage at point of interconnection 42 is less than the predetermined threshold value, a refresh is required and the method proceeds to step 76. At step 76, the selected row of memory array 2 is read by operation of read/write control module 24 and the selector and driver modules 26, 28 and 30 using the read voltage determined in step 70. Then, at step 78, the data that has just been read (stored in latches 56 shown in FIG. 3B) is written back to the selected row by operation of read/write control module 24 and the selector and driver modules 26, 28 and 30. The method then proceeds to step 80. At step 80, since a write operation has just occurred, the refresh trigger circuit 38 associated with the selected row is "refreshed" as described above. The method then returns to step 60.

Thus, in the scheme just described, for each new write to a role of memory array 2, refresh trigger circuit 38 associated with the row is refreshed. In addition, for each read operation that is performed, the refresh trigger circuit 38 of the selected row is read to determine whether a refresh of the row being read is needed and to determine the read voltage that is to be used. As noted above, a latch 56 is coupled to the source line of each column in memory array 2. Latches 56 are normally transparent. However, if a refresh is triggered, latches 56 become opaque and transmit the last read data, which is the data stored in the row in question. Using the data values from latches 56 as inputs to read/write control module 24, appropriate logic levels will be rewritten to the cells of memory array 2 as an automated operation. Finally, each refresh trigger circuit 38 is refreshed each time that associated row is refreshed in order to keep track of memory window for that row.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A memory device, comprising:
    a memory array including a plurality of rows, each row having a plurality of storage elements;
    a plurality of refresh trigger circuits, each refresh trigger circuit being associated with a respective one of the rows, each refresh trigger circuit being structured to produce an output signal indicative of an estimated degradation of a memory window of one or more of the storage elements of the associated one of the rows; and
    control circuitry coupled to each of the refresh trigger circuits, wherein the control circuitry is structured and configured to determine whether to initiate a refresh of the storage elements of a particular one of the rows based on the output signal produced by the refresh trigger circuit associated with the particular one of the rows, wherein each refresh trigger circuit: (i) includes a first storage element and a second storage element, wherein the first storage element is coupled to the second storage element at a point of interconnection such that the first storage element and the second storage element are connected in series, and (ii) is structured to produce the output signal of the refresh trigger circuit at the point of interconnection responsive to a first read voltage being applied to the first storage element of the refresh trigger circuit and a second read voltage being applied to the second storage element of the refresh trigger circuit.

2. The memory device according to claim 1, wherein the control circuitry coupled to each of the refresh trigger circuits is structured and configured to determine whether to initiate the refresh of the storage elements of the particular one of the rows by comparing the output signal produced by the refresh trigger circuit associated with the particular one of the rows to a threshold level.

3. The memory device according to claim 1, wherein the control circuitry is structured and configured to, responsive to initiation of a read operation for the particular one of rows, read the refresh trigger circuit associated with the particular one of the rows to cause the output signal to be produced by the refresh trigger circuit associated with the particular one of the rows, and thereafter determine whether to initiate the refresh based on the output signal.

4. The memory device according to claim 3, wherein the control circuitry is structured and configured to, responsive to determining that the refresh is to be initiated, read data from the particular one of the rows, write the data back to the particular one of the rows, and refresh the refresh trigger circuit associated with the particular one of the rows by programming the first storage element to a first state and programming the second storage element to a second state different than the first state.

5. The memory device according to claim 1, wherein the control circuitry is structured and configured to refresh the refresh trigger circuit associated with the particular one of the rows by programming the first storage element of the refresh trigger circuit associated with the particular one of the rows to a first state and programming the second storage element of the refresh trigger circuit associated with the particular one of the rows to a second state different than the first state whenever data is written to the particular one of the rows.

6. The memory device according to claim 1, wherein the memory device is an FeDRAM, wherein each of the plurality of storage elements is an FeFET, wherein the first storage element comprises a first FeFET having a first gate, a first drain, and a first source, and the second storage element comprises a second FeFET having a second gate, a second drain, and a second source, wherein the first source is connected to the second drain at the point of interconnection.

7. The memory device according to claim 6, wherein each refresh trigger circuit is structured to produce the output signal at the point of interconnection responsive to the first read voltage being applied to the first gate, the second read voltage being applied to the second gate, a first predetermined bias being applied to the first drain, and a second predetermined bias being applied to the second source.

8. The memory device according to claim 1, further comprising an adaptive read voltage generation circuit coupled to the refresh trigger circuits for generating read voltages for reading data from the memory array.

9. The memory device according to claim 8, wherein the adaptive read voltage generation circuit includes a first divider circuit and a second divider circuit, wherein the adaptive read voltage generation circuit is structured to generate a read voltage for a selected one of the rows based on the output signal produced by the refresh trigger circuit associated with the selected one of the rows.

10. The memory device according to claim 9, wherein the first divider circuit comprises a first divider transistor coupled to a second divider transistor, and the second divider circuit comprises a third divider transistor coupled to a fourth divider transistor, wherein the second divider circuit is cascaded with the first divider circuit, wherein a gate voltage of the first divider transistor is controlled by the output signal of the refresh trigger circuit associated with the selected one of the rows, wherein a gate voltage of the second divider transistor is controlled by a first bias voltage, wherein a gate voltage of the third divider transistor is controlled by an output of the first divider circuit, wherein a gate voltage of the fourth divider transistor is controlled by a second bias voltage, and wherein an output of the second divider circuit provides the read voltage for the selected one of the rows.

11. A method of controlling a memory device including a memory array having a plurality of rows, each row having a plurality of storage elements, comprising:
producing for each of the rows an output signal indicative of an estimated degradation of a memory window of one or more of the storage elements of the row;
determining whether to initiate a refresh of the storage elements of a particular one of the rows based on the output signal associated with the particular one of the rows;
responsive to initiation of a read operation for the particular one of rows, reading the output signal associated with the particular one of the rows, and thereafter determine whether to initiate the refresh based on the read output signal; and
responsive to determining that the refresh is to be initiated, reading data from the particular one of the rows, writing the data back to the particular one of the rows, and refreshing a refresh trigger circuit associated with the particular one of the rows by programming a first storage element the refresh trigger circuit to a first state and programming a second storage element refresh trigger circuit to a second state different than the first state, wherein the refresh trigger circuit produces the output signal associated with the particular one of the rows.

12. A method of controlling a memory device including a memory array having a plurality of rows, each row having a plurality of storage elements, comprising:
producing for each of the rows an output signal indicative of an estimated degradation of a memory window of one or more of the storage elements of the row;
determining whether to initiate a refresh of the storage elements of a particular one of the rows based on the output signal associated with the particular one of the rows; and
refreshing a refresh trigger circuit associated with a second particular one of the rows by programming a first storage element of the refresh trigger circuit to a first stale and programming a second storage element of the refresh trigger circuit to a second state different than the first state whenever data is written to the second particular one of the rows, wherein the refresh trigger circuit produces the output signal associated with the particular one of the rows.

13. The method according to claim 12, further comprising generating a read voltage for a selected one of the rows based on the output signal produced for the selected one of the rows, wherein the generating the read voltage for a selected one of the rows based on the output signal produced for the selected one of the rows comprises providing the output signal produced for the selected one of the rows to a plurality of cascaded voltage dividers.

14. The method according to claim 13, wherein the memory device is an FeDRAM, and wherein each of the plurality of storage elements is an FeFET.

15. The method according to claim 11, further comprising generating a read voltage for a selected one of the rows based on the output signal produced for the selected one of the rows.

16. The method according to claim 15, wherein the generating the read voltage for a selected one of the rows based on the output signal produced for the selected one of the rows comprises providing the output signal produced for the selected one of the rows to a plurality of cascaded voltage dividers.

17. The method according to claim 11, wherein the memory device is an FeDRAM, and wherein each of the plurality of storage elements is an FeFET.

18. A memory device, comprising:
a memory array including a plurality of rows, each row having a plurality of storage elements;
a plurality of refresh trigger circuits, each refresh trigger circuit being associated with a respective one of the rows, each refresh trigger circuit being structured to produce an output signal indicative of an estimated degradation of a memory window of one or more of the storage elements of the associated one of the rows;
control circuitry coupled to each of the refresh trigger circuits, wherein the control circuitry is structured and configured to determine whether to initiate a refresh of the storage elements of a particular one of the rows based on the output signal produced by the refresh trigger circuit associated with the particular one of the rows; and
an adaptive read voltage generation circuit coupled to the refresh trigger circuits for generating read voltages for reading data from the memory array, wherein the adaptive read voltage generation circuit includes a first divider circuit and a second divider circuit, wherein the adaptive read voltage generation circuit is structured to generate a read voltage for a selected one of the rows based on the output signal produced by the refresh trigger circuit associated with the selected one of the rows, wherein the first divider circuit comprises a first divider transistor coupled to a second divider transistor, and the second divider circuit comprises a third divider transistor coupled to a fourth divider transistor, wherein the second divider circuit is cascaded with the first divider circuit, wherein a gate voltage of the first divider transistor is controlled by the output signal of the refresh trigger circuit associated with the selected one of the rows, wherein a gate voltage of the second divider transistor is controlled by a first bias voltage, wherein a gate voltage of the third divider transistor is controlled by an output of the first divider circuit, wherein a gate voltage of the fourth divider transistor is controlled by a second bias voltage, and wherein an output of the second divider circuit provides the read voltage for the selected one of the rows.

19. The memory device according to claim 18, wherein each refresh trigger circuit: (i) includes a first storage element and a second storage element, wherein the first storage element is coupled to the second storage element at a point of interconnection such that the first storage element and the second storage element are connected in series, and (ii) is structured to produce the output signal of the refresh trigger circuit at the point of interconnection responsive to a first read voltage being applied to the first storage element of the refresh trigger circuit and a second read voltage being applied to the second storage element of the refresh trigger circuit, wherein the control circuitry is structured and configured to, responsive to initiation of a read operation for the particular one of rows, read the refresh trigger circuit associated with the particular one of the rows to cause the output signal to be produced by the refresh trigger circuit associated with the particular one of the rows, and thereafter determine whether to initiate the refresh based on the output signal, wherein the control circuitry is further structured and configured to, responsive to determining that the refresh is to be initiated, read data from the particular one of the rows, write the data back to the particular one of the rows, and refresh the refresh trigger circuit associated with the particular one of the rows by programming the first storage element to a first state and programming the second storage element to a second state different than the first state, wherein the control circuitry is structured and configured to refresh the refresh trigger circuit associated with the particular one of the rows by programming the first storage element of the refresh trigger circuit associated with the particular one of the rows to a first state and programming the second storage element of the refresh trigger circuit associated with the particular one of the rows to a second state different than the first state whenever data is written to the particular one of the rows.

20. The memory device according to claim 19, wherein the memory device is an FeDRAM, and wherein each of the plurality of storage elements is an FeFET.

* * * * *